(12) United States Patent
Butler et al.

(10) Patent No.: US 10,310,392 B2
(45) Date of Patent: Jun. 4, 2019

(54) POSITIONING DEVICE, LITHOGRAPHIC APPARATUS AND DEVICE MANUFACTURING METHOD

(71) Applicant: ASML NETHERLANDS B.V., Veldhoven (NL)

(72) Inventors: Hans Butler, Best (NL); Johannes Petrus Martinus Bernardus Vermeulen, Leende (BE); Engelbertus Antonius Fransiscus Van Der Pasch, Oirschot (NL)

(73) Assignee: ASML NETHERLANDS B.V., Veldhoven (NL)

( * ) Notice: Subject to any disclaimer, the term of this patent is extended or adjusted under 35 U.S.C. 154(b) by 0 days.

(21) Appl. No.: 15/776,995

(22) PCT Filed: Nov. 17, 2016

(86) PCT No.: PCT/EP2016/077947
§ 371 (c)(1),
(2) Date: May 17, 2018

(87) PCT Pub. No.: WO2017/089214
PCT Pub. Date: Jun. 1, 2017

(65) Prior Publication Data
US 2018/0335705 A1    Nov. 22, 2018

(30) Foreign Application Priority Data
Nov. 23, 2015   (EP) .................................... 15195812

(51) Int. Cl.
*G03F 7/20*   (2006.01)

(52) U.S. Cl.
CPC .......... *G03F 7/70775* (2013.01); *G03F 7/709* (2013.01); *G03F 7/70716* (2013.01); *G03F 7/70758* (2013.01); *G03F 7/70766* (2013.01)

(58) Field of Classification Search
CPC .. G03F 7/709; G03F 7/70716; G03F 7/70758; G03F 7/70775
(Continued)

(56) References Cited

U.S. PATENT DOCUMENTS 6,408,767 B1    6/2002  Binnard et al.
6,686,991 B1 *  2/2004  Binnard .............. G03F 7/70716
                                                    250/492.2
(Continued)

FOREIGN PATENT DOCUMENTS

EP    1124078 A2    8/2001
EP    1983371 B1   10/2008

OTHER PUBLICATIONS

English Translation of Chinese Office Action dated Nov. 15, 2017.
(Continued)

*Primary Examiner* — Hung Nguyen
(74) *Attorney, Agent, or Firm* — Arent Fox LLP

(57) ABSTRACT

A positioning device comprising an object table and a positioning module configured to position the object table. The positioning module comprises a first positioning module member configured to hold the object table, a second positioning module member configured to support the first positioning module member, and a support frame configured to support the second positioning module member. The positioning module also includes one or more actuators, a position measurement system configured to measure a position of the object table, and a control unit configured to control a position of the object table based on the measured position of the object table. The control unit is further configured to control a vertical position of the second position module member so as to maintain a top surface of (Continued)

the second positioning module member substantially parallel to a bottom surface of the first positioning module member.

18 Claims, 6 Drawing Sheets

(58) Field of Classification Search
USPC .................................................. 355/72–76
See application file for complete search history.

(56) References Cited

U.S. PATENT DOCUMENTS

| | | |
|---|---|---|
| RE41,232 E | 4/2010 | Hazelton et al. |
| 2001/0040324 A1* | 11/2001 | Mayama ................. F16F 15/02 |
| | | 267/136 |
| 2002/0050571 A1 | 5/2002 | Watson |
| 2009/0014932 A1 | 1/2009 | Nikaido et al. |
| 2012/0024227 A1 | 2/2012 | Takasuka et al. |
| 2014/0375975 A1* | 12/2014 | Van De Ven ....... G03F 7/70758 |
| | | 355/72 |

OTHER PUBLICATIONS

International Search Report PCT/EP2016/077947 dated Feb. 8, 2017.

* cited by examiner

POSITIONING DEVICE, LITHOGRAPHIC APPARATUS AND DEVICE MANUFACTURING METHOD

CROSS-REFERENCE TO RELATED APPLICATIONS

This application is the U.S. National Stage Application of International Patent Application No. PCT/EP2016/077947, filed on Nov. 17, 2016 which claims priority of EP application 15195812.1 which was filed on Nov. 23, 2015 both of which are incorporated herein in their entirety by reference.

BACKGROUND

Field of the Invention

The present invention relates to a positioning device, a lithographic apparatus and a method for manufacturing a device.

Description of the Related Art

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. In order to ensure proper operation of the integrated circuit that is manufactured, an accurate positioning of the pattern relative to the substrate is required.

To provide in such accurate positioning, a positioning device including a so-called short-stroke module and a long-stroke module are often applied to position the substrate, e.g. relative to a reference frame such as a frame to which the projection system is mounted. Such a short-stroke module may e.g. comprise a plurality of actuators, e.g. electromagnetic actuators that enable a fine positioning of an object, e.g. an object table provided with a substrate, over comparatively small distances, e.g. less than or equal to a few mm. In order to displace the object table over larger distances, the short-stroke module may be mounted to a so-called long-stroke module which enables to displace the short-stroke module holding the object table over comparatively large distances, e.g. 500 mm or more. Such a long-stroke module may e.g. comprises a planar motor or a combination of multiple linear motors to displace the short stroke positioner in a substantially horizontal plane, e.g. below the projection system. In such arrangement, the long-stroke module is often displaceably mounted or supported onto a base frame of the apparatus, whereby a stator of the long-stroke module may e.g. be configured to operate as a balance mass when a reaction force is exerted on the stator, the reaction force being a reaction to a force generated on a mover of the long-stroke module. In such an arrangement, the mover of the long-stroke module is typically subjected to reaction forces originating from the short-stroke module that is mounted to it. Such reaction forces may cause an undesired vibration of the mover of the long-stroke module which may adversely affect the fine positioning of the object table by the short-stroke module. It would be desirable to provide in a long-stroke module in which the effects of such vibrations would be mitigated.

SUMMARY

It is desirable to provide in a positioning device whereby a fine positioning of an object is less affected by vibrations of a positioning module of a positioning device. According to an embodiment of the invention, there is provided a positioning device configured to position an object, the positioning device comprising:
  an object table configured to hold the object;
  a positioning module configured to position the object table, the positioning module comprising:
    a first positioning module member configured to hold the object table;
    a second positioning module member configured to support the first positioning module member and to co-operate with the first positioning module member to generate a first force;
  a support frame configured to support the second positioning module member;
  one or more actuators configured to displace the second positioning module member in a vertical direction relative to the support frame;
  a position measurement system configured to measure a position of the object table with respect to a reference frame; and
  a control unit configured to control a position of the object table by providing an object table control signal to the positioning module to generate the first force, based on the measured position of the object table and a set point for the object table;
wherein the control unit is further configured to control a vertical position of the second position module member by provide an actuator control signal to the one or more actuators, so as to maintain a top surface of the second positioning module member substantially parallel to a bottom surface of the first positioning module member.

According to another aspect of the present invention, there is provided a positioning device configured to position an object, the positioning device comprising:
  an object table configured to hold the object;
    a positioning module configured to position the object table, the positioning module comprising a top module and a bottom module;
    the top module comprising:
      a first top module member configured to hold the object table;
      a second top module member configured to co-operate with the first top module member to generate a first force on the object table;
    the bottom module comprising:
      one or more actuators;
      a first bottom module member onto which the second top module member is displaceably mounted by means of the one or more actuators; the actuators being configured to displace the second top module member in a vertical direction relative to the first bottom module member;

a second bottom module member configured to support the first bottom module member and to co-operate with the first bottom module member to generate a second force on the first top module member;

a support frame configured to support the second bottom module member;

a position measurement system configured to measure a position of the object table with respect to a reference frame;

a control unit configured to control a position of the object table by providing an object table control signal to the positioning module to generate the first force and the second force, based on the measured position of the object table and a set point for the object table;

wherein the control unit is further configured to control a vertical position of the second top module member by providing an actuator control signal to the one or more actuators, in order to maintain the second top module member within the operating range of the first top module member in the vertical direction.

According to yet another aspect of the present invention, there is provided a lithographic apparatus comprising:

an illumination system configured to condition a radiation beam;

a support constructed to support a patterning device, the patterning device being capable of imparting the radiation beam with a pattern in its cross-section to form a patterned radiation beam;

a substrate table constructed to hold a substrate; and a projection system configured to project the patterned radiation beam onto a target portion of the substrate, wherein the lithographic apparatus further comprise a positioning device according to the present invention.

According to yet another aspect of the present invention, there is provided a device manufacturing method comprising projecting a patterned beam of radiation onto a substrate, wherein the step of projection the patterned beam onto the substrate is preceding by positioning the substrate relative to the patterned beam by a positioning device according to the present invention.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
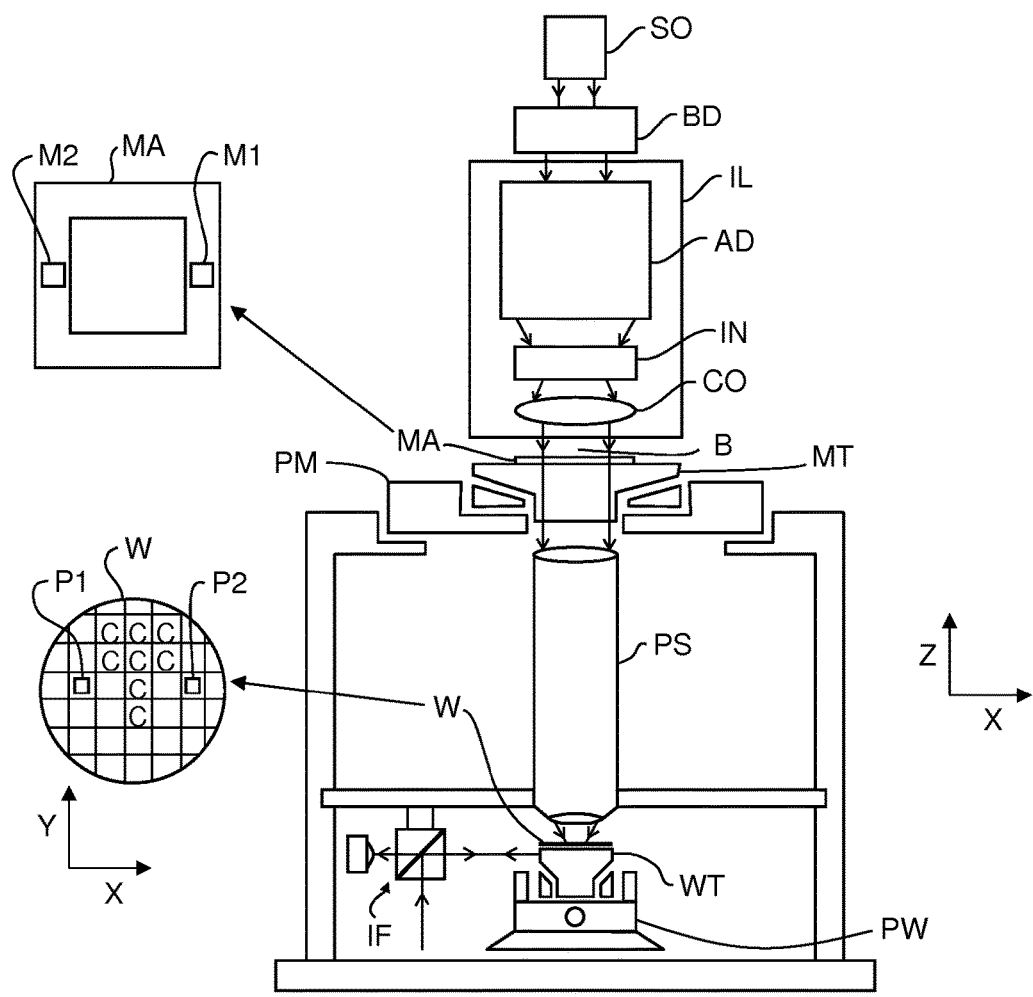
FIG. 1 depicts a lithographic apparatus according to an embodiment of the invention.

FIG. 1 schematically depicts a lithographic apparatus according to one embodiment of the invention. The apparatus includes an illumination system (illuminator) IL configured to condition a radiation beam B (e.g. UV radiation or any other suitable radiation), a mask support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The mask support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The mask support structure can use mechanical, vacuum, electrostatic or other clamping techniques to hold the patterning device. The mask support structure may be a frame or a table, for example, which may be fixed or movable as required. The mask support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask MA), which is held on the mask support structure (e.g., mask table MT), and is patterned by the patterning device. Having traversed the mask MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of a second positioning device PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

In step mode, the mask table MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

In scan mode, the mask table MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the mask table MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

In another mode, the mask table MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

The lithographic apparatus according to the present invention may comprise, either as a first positioning device PM or as a second positioning device PW or both, a positioning device according to the present invention. The positioning device according to the present invention will be explained in more detail below, in particular with respect to FIGS. 3 to 6. The positioning device according to the present invention comprises at least one positioning module. Within the meaning of the present invention, positioning module is use to denote one or more positioners, actuators or motors such as piezo-electrical, magnetic or pneumatic actuators or motors that are configured to exert a force. Such a positioning module may e.g. comprise a planar motor for displacing an object table such as the mask table MT or substrate table WT. In an embodiment, the positioning device according to the present invention comprises two or at least two positioning modules. In view of the fact that there are various requirements with respect to the positioning of a substrate or patterning device in a lithographic apparatus, it may be advantageous to apply multiple positioning modules, each having its own characteristic and advantages. In an embodiment, the positioning device according to the present invention may e.g. have a first positioning module for providing a fine positioning in one or more degrees of freedom and a second positioning module for providing a coarse positioning in one or more degrees of freedom. In such embodiment, an object table that is to be accurately positioned may e.g. be mounted to the first positioning module whereas the first positioning module is mounted to the second positioning module. Such an arrangement may e.g. enable to both meet the requirement of an accurate positioning of an object table and the requirement of displacing the object table over comparatively large distances, e.g. between a loading/unloading position, where an object is loaded or unloaded and an exposure position where the object is e.g. subjected to a patterned beam of radiation. In such an arrangement, the first positioning module may e.g. be configured to accurately displace the object table over comparatively small distances, e.g. by means of a plurality of electromagnetic actuators, whereas the second positioning module comprises a planar motor enabling a displacement of the object table and the first positioning device over comparatively large distances. In an embodiment, the first positioning module may also be referred to as the top module, while the second positioning module is referred to as the bottom module. In such arrangement, the top module is configured to hold the object table while the bottom module is configured to hold the top module and is displaceably mounted to or supported by a support frame and is in general, at least partly, arranged below the top module. Note that the first positioning module as applied in an embodiment of the present invention may also be referred to as a short-stroke module or a fine positioning module, while the second positioning device may be referred to as a long-stroke module or a coarse positioning module.

Figure 2:
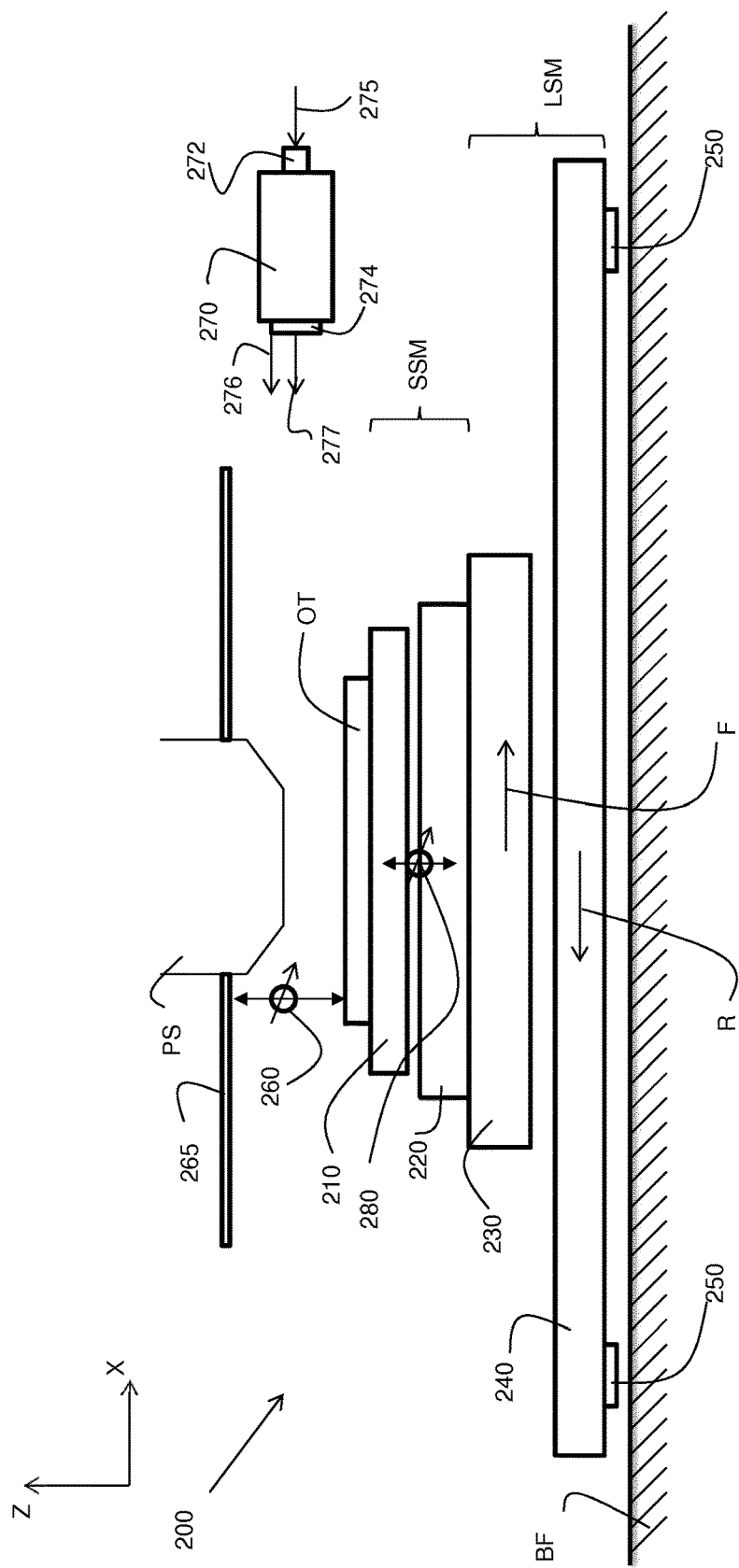
FIG. 2 schematically depicts a positioning device as known in the art.

FIG. 2 schematically shows a positioning device 200 as known in the art. The positioning device 200 comprises a top module SSM and a bottom module LSM. As schematically shown, the top module SSM comprises a first top module member 210 and a second top module member 220. The first top module member of the top module is configured to hold an object table OT. The first top module member 210 and the second top module member 220 may e.g. form a plurality of actuators, e.g. electromagnetic actuators that enable a fine positioning of the object table OT, e.g. an object table provided with a substrate. Typically, the top module SSM is configured to enable a displacement of the first top module member 210 relative to the second top module member 220 over comparatively small distances, e.g. less than or equal to a few mm, but with a high accuracy. In order to displace the object table OT over larger distances, the top module SSM may be mounted to the bottom module LSM which enables to displace the top module SSM holding the object table OT over comparatively large distances, e.g. 300 mm or more. The bottom module LSM as shown comprises a first bottom module member 230 and a second bottom module member 240 that may e.g. form a planar motor to displace the top module SSM in a substantially horizontal plane, e.g. below a projection system PS. In such an arrangement, the first bottom module member 230 may e.g. comprises a two-dimensional array of permanent magnets, whereas the second bottom module member 240 is provided with a plurality of coils which can be provided with a current, thereby generating a force on the first bottom module member 230. Alternatively, the first bottom module member 230 may e.g. be provided with a plurality of coils, while the second bottom module member 240 comprises a two-dimensional array of permanent magnets. In case of a planar motor as the bottom module, the first bottom module member 230 of the LSM is typically mounted on top of the second bottom module member 240. In such case, the LSM may comprise an air bearing for maintaining the first bottom module member 230 and the second bottom module member 240 spaced apart in the vertical direction Z. Alternatively, the planar motor may be configured to generate vertical forces to maintain the first bottom module member 230 and the second bottom module member 240 spaced apart in the vertical direction Z. In the arrangement as shown, the bottom module LSM is mounted to a base frame or support frame BF, in such manner that the second bottom module member 240 may displace relative to the base frame BF in the horizontal plane, e.g. in response of a horizontal reaction force exerted on the second bottom module member 240. Such an arrangement is also known as a balance mass arrangement whereby, when a force F is applied to the first bottom module member 230, e.g. to displace the SSM and the OT, an equal but opposite reaction force R is acting on the second bottom module member 240, displacing the second bottom module member 240 in the opposite direction. In order to enable the second bottom module member 240 to displace relative to the base frame BF, an air bearing 250 including a plurality of air bearing pads may be arranged in between the second bottom module member 240 and the base frame BF. The operation of the positioning device 200 as shown in FIG. 2 to position a substrate that is mounted on the object table OT can be understood as follows: in order to project a pattern onto a particular region, referred to as a target portion, on a substrate held by the object table, an accurate positioning of the substrate relative to the projection system PS is required. In order to realize, the positioning device 200 further comprises a position measurement system 260 configured to accurately measure a position of the object table relative to the projection system PS. Examples of such a position measurement system 260 include interferometer based measurement systems or encoder based measurement systems. As such, item 265 may e.g. represent a grating target of an encoder based measurement system. Such systems may e.g. be configured to determine a position of the object table OT in 6 degrees of freedom (6 DOF). The positioning device 200 further comprises a control unit 270 configured to generate control signals for controlling both the SSM and the LSM. As an input, the control unit 270 may receive a so-called set point 275, e.g. at an input terminal 272 of the control unit 270 indicating a desired position of the object table OT. It is assumed that the position of the substrate relative to the object table OT is known and fixed; as such, the position of the substrate can be controlled by controlling the position of the object table. Based on a measurement position of the object table OT, e.g. measured using the measurement system 260, and a set point 275, the control unit 270 may then generate a top control signal 276 and output the control signal via an output terminal 274 to control the top module SSM, i.e. to generate a first force on the first top module member 210 holding the object table OT such that the object table OT is displaced to the desired position, indicated by the set point 275. In case the object table OT displaces, (under the influence of the force exerted on the first top module member 210) a position of the first top module member 210 relative to the second top module member 220 will change. Because the SSM only has a limited operation range, a displacement of the first top module member 210 relative to the second top module member 220 should be counteracted. This is done by the LSM, whereby a bottom control signal 277 for the LSM is generated by the control unit 270, whereby this bottom control signal 277 can be based on a position measurement of the first top module member relative to the second top module member. In order to realize this, the positioning device 200 is equipped with a second position measurement system 280 configured to measure a position of the first top module member relative to the second top module member. Based on a relative position measurement of this position measurement system 280, the control unit 270 may generate a bottom control signal 277 to control the LSM, i.e. to generate a second force on the first bottom module member 230 to which the second top module member 220 is mounted, such that the second top module member 220 is displaced so as to maintain a position of the first top module member 210 relative to the second top module member 220 within the desired operating range. In case this second force has a horizontal component F, the second bottom module member 240 will displace in reaction to the horizontal reaction force R of the horizontal component F of the second force, which acts on the second bottom module member 240.

The positioning device 200 as described and depicted in FIG. 2 has the following drawbacks: the second bottom module member 240 acts, as indicated, as a balance mass in the horizontal plane. As such, forces acting on the second bottom module member 240 in the X-direction, the Y-direction and in the Rz direction (a rotation about the Z-axis) can be absorbed by the second bottom module member 240 as balance mass. Forces acting in the vertical direction, i.e. the Z-direction and rotations about the X-axis (Rx) or the Y-axis (Ry), perpendicular to the XZ-plane, are not absorbed but may cause vibrations of the first bottom module member 230, which may adversely affect the positioning accuracy of the top module SSM. Further, bottom module LSM is configured, as described above, to follow the top module SSM, i.e. to stay within the operating range of the SSM, while the position of the top module is determined relative to the projection system PS. In general, the projection system PS is mounted to a reference frame that is different from the base frame BF. Typically, the reference frame is isolated, by means of vibration isolators, from the base frame BF. Because of tolerances between both frames, a comparatively large gap needs to be applied between the first bottom module member 230 and the second bottom module member 240 in order to allow the second bottom module member 240 to follow the first top module member 210, in particular with respect to forces acting in the vertical direction, while the horizontal position of the second bottom module member 240 is determined by the base frame. Such a comparatively large airgap however adversely affects the efficiency of the bottom module LSM and prevents an effective damping of vibrations of the first bottom module member 230.

It would thus be desirable to apply a comparatively small air gap in the LSM, in particular when a planar motor is applied as LSM, to increase the efficiency of the LSM and to provide in an improved damping of vibrations of the first bottom module member 230.

The present invention provides, in an embodiment, in a positioning device that enables to apply a smaller air gap in the LSM, thus enabling an increased efficiency of the LSM and to provide in an improved damping of vibrations of the LSM.

Figure 3:
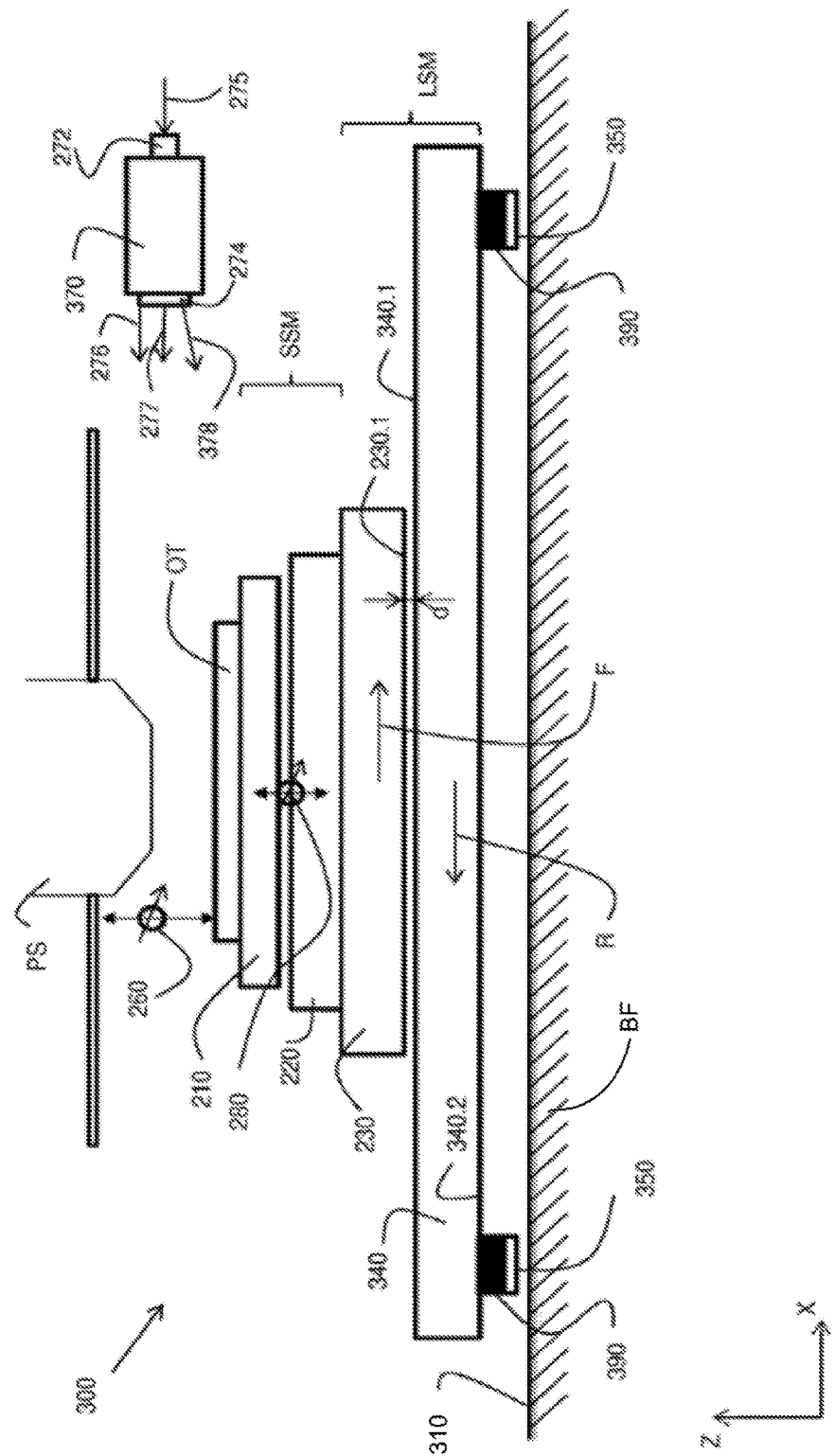
FIG. 3 depicts a first embodiment of a positioning device according to the present invention.

FIG. 3 schematically shows a first embodiment of a positioning device 300 according to the present invention. The first embodiment of the positioning device according to the present invention comprises a positioning module that comprises a top module SSM, a bottom module LSM, position measurement systems 260 and 280 and a control unit for generating control signals 276 and 277 to control the SSM and the LSM. In accordance with the present invention, a control unit such as the control unit 370 as shown in FIG. 3 may e.g. be implemented as a processor, a microprocessor, a microcontroller, a computer or the like. In an embodiment, the control unit 370 may e.g. comprises a memory unit for storing data such as measurement data of position measurement system or set point data and a processing unit for processing the data and determine the control signals for controlling the SSM and the LSM. In the first embodiment as shown, the second bottom module member 240 is displaceably mounted to a base frame or support frame BF, by means of an air bearing indicated by the air bearing pads 350. As an alternative to the use of an air bearing, leaf springs or flexible support may also be considered, as explained in more detail below. It should however be noted that, in an embodiment of the present invention, it may be sufficient that the base frame or support frame BF merely supports the second bottom module member 240, e.g. via rigid supports. In such case however, a substantial reaction force R, in response to a horizontal force F may act on the base frame, via the rigid supports. Such a situation may be undesirable as it may cause vibrations throughout the entire apparatus in which the positioning device is applied. In order to mitigate this, an alternative way to avoid or reduce the reaction force R may be applied. As an alternative, one could e.g. consider applying one or more additional first bottom module members that co-operate with the second bottom module member to generate forces such as horizontal forces. In case such additional members are e.g. configured to generate horizontal forces F' that are substantially equal to F but act in an opposite direction, the resulting reaction force acting on the second bottom module member 340 would be substantially zero. In such case, there would thus be substantially no transmission of forces to the base frame BF. In the first embodiment, the second bottom module member 340 is, in contrast to the second bottom module member 240 of FIG. 2, further configured to be displaceable in the vertical direction. Within the meaning of the present invention, a displacement in the vertical direction (Z-direction) includes a translation in the Z-direction but also a rotation about a horizontal axis such as the X-axis (Rx) or the Y-axis (Ry). In order to render the second bottom module member 340 displaceable in the vertical direction, one or more actuators are provided that are configured to enable a displacement of the second bottom module member 340 relative to the base frame BF in the vertical direction. As explained above with reference to FIG. 2, the second bottom module member 240 of the LSM is typically configured to displace in a horizontal plane, substantially parallel to a top plane of the base frame. In the positioning device of FIG. 2, this horizontal displacement is enabled by means of an air bearing comprising air bearing pads 250 that are mounted to a bottom surface of the second member 240. Through these air bearing pads 250, a flow of air is directed towards the facing surface, i.e. a top surface of the base frame BF, thus generating a repelling force between the base frame BF and the second bottom module member 240, thus generating an air gap in between the air bearing pads 250 and the base frame BF that is substantially constant.

In the first embodiment of the positioning device according to the present invention, as shown in FIG. 3, there is also an air bearing 350 applied to enable the second bottom module member 340 to displace in parallel to the top surface 310 of the base frame BF. However, in contrast to the air bearing arrangement 250 of FIG. 2, the air bearing pads 350 as applied in the first embodiment shown in FIG. 3, are displaceable in the vertical direction by means of actuators 390 that are mounted between the air bearing pads 350 and the bottom surface 340.2 of the second bottom module member 340. As an example of suitable actuators to realize such displacement, piezo-electrical, magnetostrictive actuators, camdisc-like actuators or pneumatic actuators can be mentioned. By means of such actuators, the distance between the air bearing pads 350 and the second long-stroke member 340 in the vertical direction can be adjusted. In accordance with the first embodiment of the present invention, the control unit 370 of the positioning device 300 is configured to generate an actuator control signal 378 to control the actuators 390 that are mounted between the air bearing pads 350 and the second bottom module member 340, so as to control a vertical position of the second bottom module member 340. In particular, based on a relative position measurement of the position measurement system 280, the control unit 370 may generate an actuator control signal 378 to control the actuators 390 to displace the second bottom module member 340 in vertical direction (Z, Rx, Ry), e.g. in line with the vertical displacements made by the second top module member 220 to maintain a position of the first top module member 210 relative to the second top module member 220 within the desired operating range. Phrased differently, a vertical position of the second bottom module member 340 is adjusted in accordance with the vertical position of the second top module member 220. By doing so, one actually maintains a bottom surface 230.1 of the first bottom module member 230 substantially parallel to a top surface 340.1 of the second bottom module member 340 and, as a result, a smaller gap d can be applied between the first bottom module member 230 and the second bottom module member 340 as shown in FIG. 3. Note that, in addition to, or as an alternative, the actuator control signal 378 to control the actuators 390 may also be based on a set point of the object table OT, in particular a Z, Rx or Ry set point, or a measured vertical position, Z, Rx or Ry of the object table OT, e.g. measured using the position measurement system 260. FIG. 4 schematically shows a more detailed view of an actuator-air bearing pad assembly as can be applied in a positioning device 300 according to the present invention.

Figure 4B:
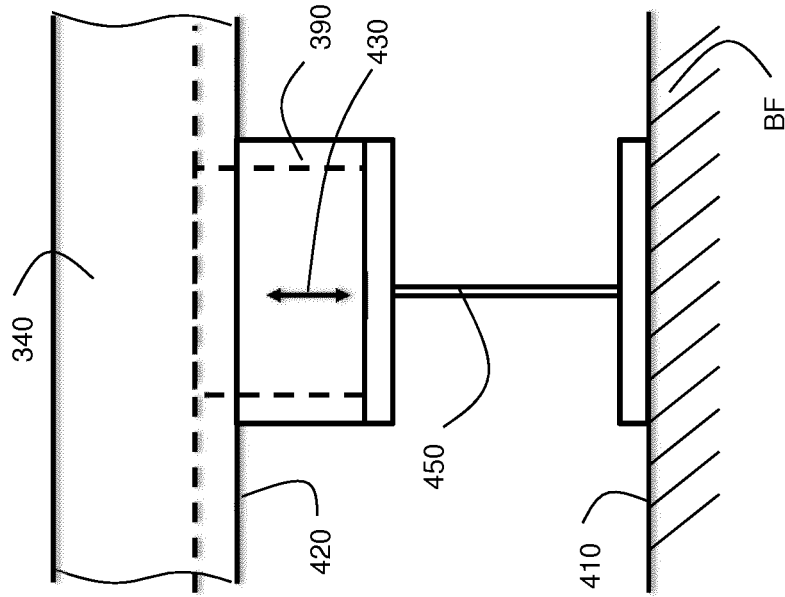
FIGS. 4a and 4b schematically depict actuator arrangements for displacing a second long-stroke module in an embodiment of the present invention.
Figure 4A:
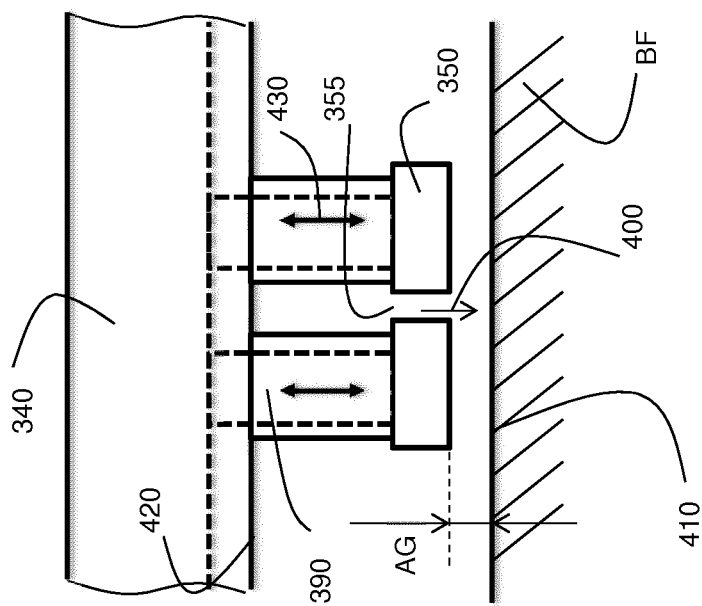

FIG. 4a schematically shows an air bearing pad 350 having a nozzle 355 through which a flow of air 400 can be projected onto a facing top surface 410 of a base frame BF. The air bearing pad 350 is mounted to a bottom surface 420 of a second bottom module member 340 by means of actuators 390, e.g. piezo-electrical actuators which can deform in the direction as indicated by the arrow 430. When the actuators 390 are made to extend, in the vertical direction (as indicated by the dotted lines), the bottom surface 420 of the second long-stroke member 340 is moved upward; the air gap AG between the air bearing pad 350 and the top surface 410 of the base frame BF remains the same. As such, by means of controlling the actuators 390, the vertical position of the second bottom module member 340 can be controlled, e.g. adjusted in line with the vertical position of the first bottom module member 230 shown in FIG. 3.

As an alternative to using an air bearing to allow the second bottom module member 340 to displace parallel to the horizontal surface of a base frame, is to use flexible supports such as leaf springs. When the second bottom module member 340 is displaceable mounted to a base frame by means of leaf springs or another type of flexible supports, the distances between the second bottom module member 340 and the base frame BF may be controlled in a similar manner.

FIG. 4b schematically depicts a detailed view of an actuator-leaf spring assembly as can be applied in an embodiment of the positioning de vice according to the present invention. FIG. 4b schematically shows a leaf spring 450 mounted to a top surface 410 of a base frame BF. The leaf spring 450 is further mounted to a bottom surface 420 of a second bottom module member 340 by means of an actuator 390, e.g. a piezo-electrical actuator which can deform in the direction as indicated by the arrow 430. When the actuator 390 is made to extend, in the vertical direction (as indicated by the dotted lines), the bottom surface 420 of the second bottom module member 340 is moved upward; thus changing the vertical position of the second long-stroke member 340. By doing so, the vertical position of the second bottom module member 340 can be controlled, e.g. adjusted in line with the vertical position of the first bottom module member 230 shown in FIG. 3.

With respect to the arrangements as shown in FIGS. 4a and 4b, it can be noted that the actuators 390 may also be mounted to the base frame side rather than on the bottom module side. In case of FIG. 4a, the air bearing pad 350 would thus be mounted to the bottom surface 410 of the base frame BF via the actuators 390.

Figure 5:
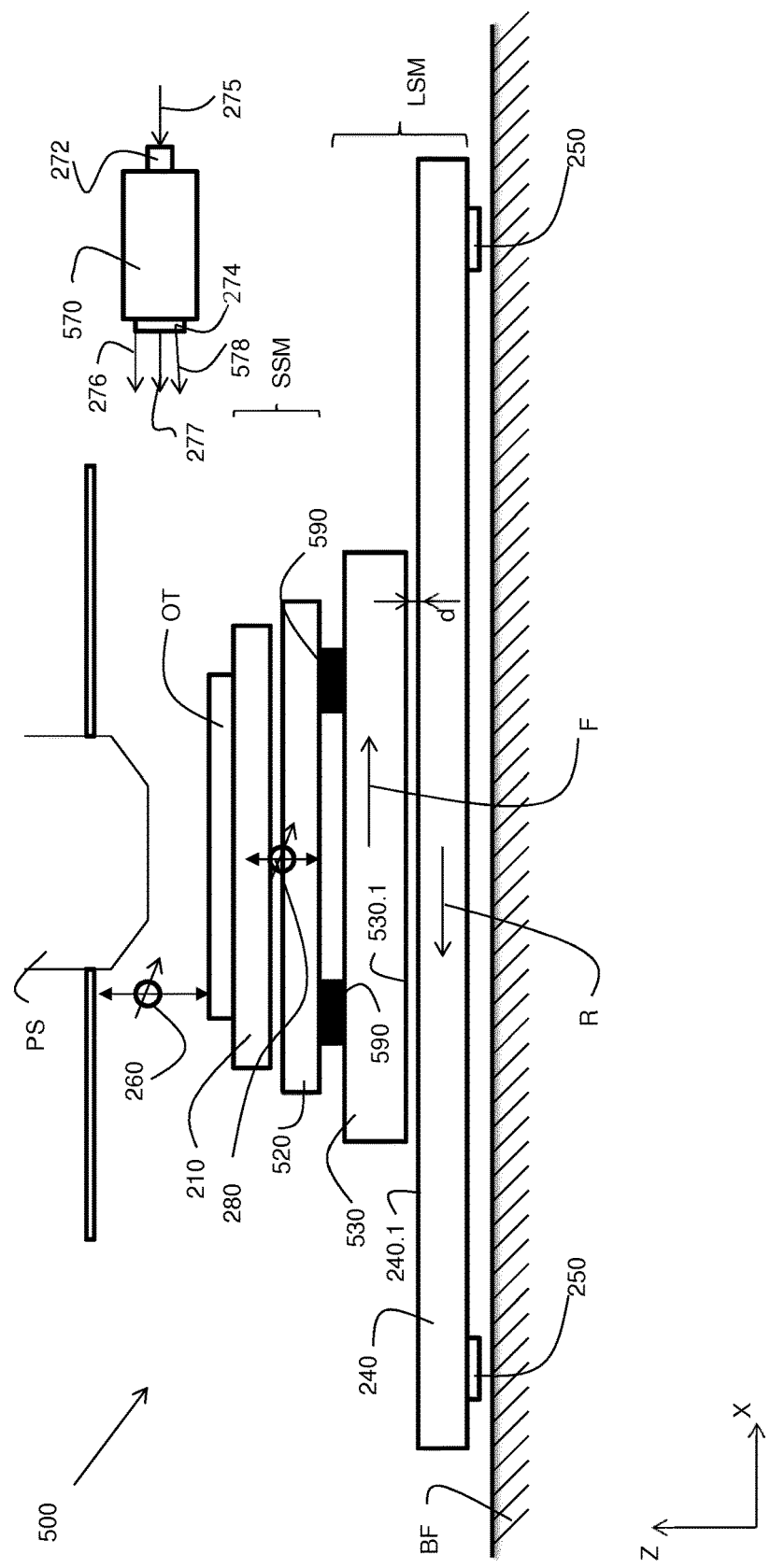
FIG. 5 schematically depicts a second embodiment of a positioning device according to the present invention.

FIG. 5 schematically shows a second embodiment 500 of a positioning device 300 according to the present invention. Similar to the positioning device 300, the second embodiment of the positioning device according to the present invention also comprises a top module SSM, a bottom module LSM, position measurement systems 260 and 280 and a control unit for generating control signals 276 and 277 to control the SSM and the LSM. Rather than providing in actuators 390 to enable a control of the vertical position of the second bottom module member of the LSM, the second embodiment of the positioning device according to the present invention comprises one or more actuators 590 that are configured to enable a vertical displacement of the second top module member 520 relative to the first bottom module member 530. By doing so, the second top module member 520 can be made to 'follow' the first bottom module member 210 in the vertical direction, while the vertical position of the first bottom module member 530 can be kept in close relationship with the second bottom module member 240. Phrased differently, the first bottom module member can be made to keep a constant comparatively small air gap relative to the second bottom module member 240 because, in contrast to the positioning device as shown in FIG. 2, the first bottom module member 530 does no longer need to 'follow' the first top module member 210; rather, because the actuators 590 enable a displacement of the second top module member 520 relative to the first top module member 530, the first bottom module member 530 does no longer need to follow the first top module member 210 in Z, Rx and Ry directions.

Suitable actuators 590 to be applied in the second embodiment of the positioning device according to the present invention are piezo-electrical, magnetostrictive, camdisc-like actuators or pneumatic actuators. By means of such actuators, the distance between the second top module member 520 and the first bottom module member 530 in the vertical direction can be adjusted. In accordance with the second embodiment of the present invention, the control unit 570 of the positioning device 500 is configured to generate an actuator control signal 578 to control the actuators 590 that are mounted between the second top module member 520 and the first bottom module member 530, so as to control a vertical position of the second top module member 520. In particular, based on a relative position measurement of the position measurement system 280, the control unit 570 may generate an actuator control signal to control the actuators 590 to displace the second top module member 520 in vertical direction (Z, Rx, Ry), to maintain a position of the first top module member 210 relative to the second top module member 520 within the desired operating range. As such, a vertical position of the second top module member 520 is adjusted in accordance with the vertical position of the first top module member 210, without the first bottom module member requiring to follow that vertical position. Rather, the bottom module LSM can be controlled in such manner that a bottom surface 530.1 of the first bottom module member 530 remains substantially parallel to a top surface 240.1 of the second bottom module member 240. By doing so, a smaller gap d can be applied between the first bottom module member 530 and the second bottom module member 240 as shown in FIG. 5. Note that, in addition to, or as an alternative, the actuator control signal 578 to control the actuators 590 may also be based on a set point of the object table OT, in particular a Z, Rx or Ry set point, or a measured vertical position, Z, Rx or Ry of the object table OT, e.g. measured using the position measurement system 260.

Figure 6:
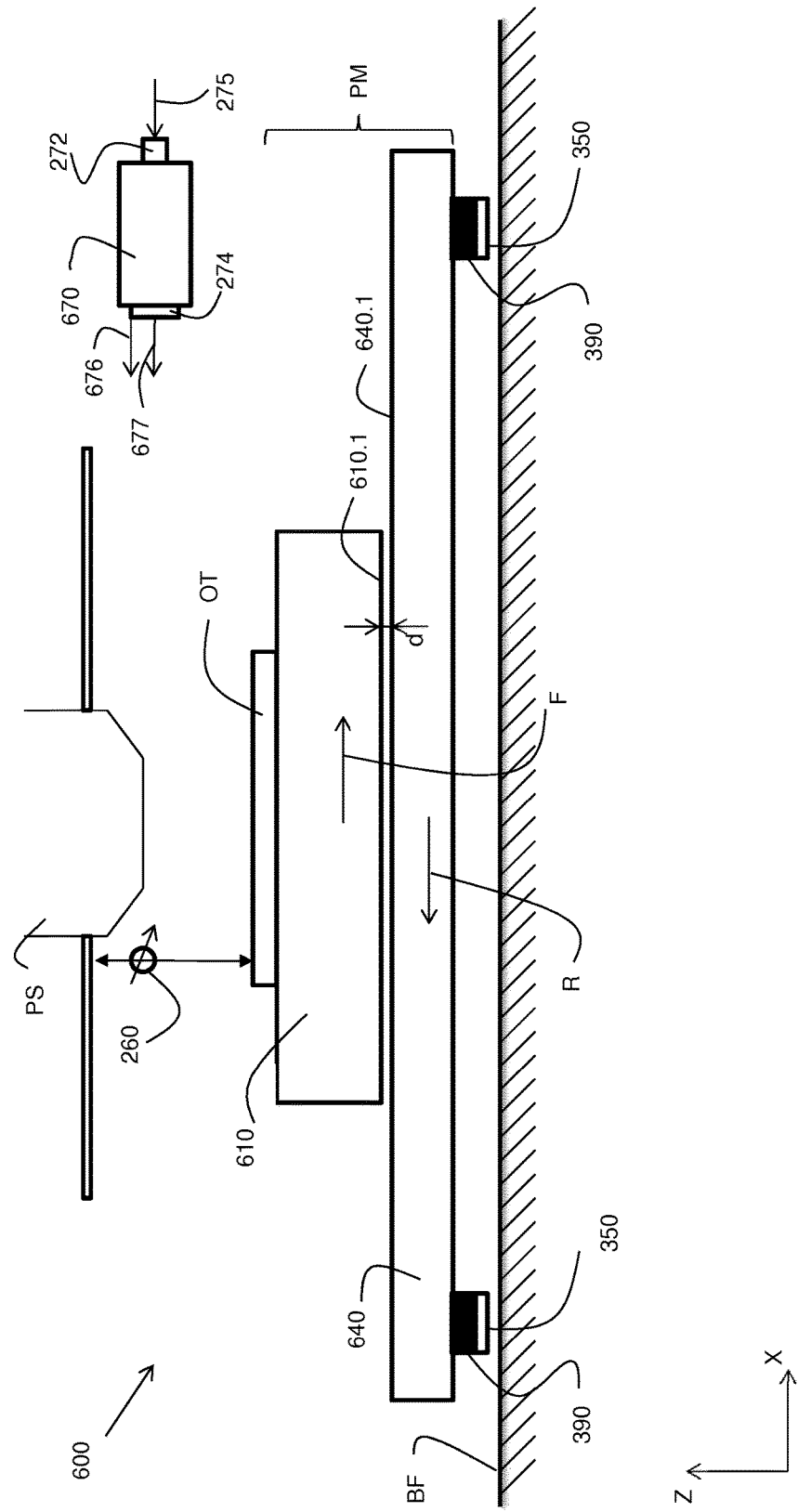
FIG. 6 schematically depicts a third embodiment of a positioning device according to the present invention.

In FIG. 6, a third embodiment of a positioning device 600 according to the present invention is schematically shown. The positioning device 600 as schematically shown comprises a positioning module PM (610, 640) for positioning an object table OT, which can be an object table configured to hold the object;

The positioning module PM as shown comprises a first positioning module member 610 that is configured to hold the object table OT and a second positioning module member 640 configured to support the first positioning module member 610 and to co-operate with the first positioning module member 610 to generate a force on the object table OT, in order to position the object.

The positioning device 600 further comprises a base frame or support frame BF that is configured to support the second positioning module member 640. In the embodiment as shown, the second positioning module member 640 is configured to displace relative to the support frame BF in response to a horizontal reaction force R, the horizontal reaction force R being a reaction to a horizontal component F of a force exerted on the first positioning module member 610. Note however that, within the meaning of the present invention, it is sufficient for the support frame or base frame BF to support the second positioning module member 640, e.g via one or more supports such as substantially rigid supports. In case such arrangement would result in excessive or undesirable vibrations, measures such as describes with reference to FIG. 3 can be taken, whereby additional first positioning module members are applied to co-operate with the second positioning module member 640, whereby the additional first positioning module members are e.g. arranged to generate forces that are equal but opposite to the force F, thus reducing or substantially cancelling a reaction force acting on the second positioning module member 640. This can e.g. be realized by means of an air bearing having air bearing pads 350 or a leaf spring arrangement as shown in FIG. 4b. Similar to the embodiment of FIG. 3, the positioning device 600 further comprises one or more actuators 390 that are configured to displace the second positioning module member 640 in a vertical direction relative to the base frame BF.

The positioning device 600 further comprises a position measurement system 260 that is configured to measure a position of the object table OT with respect to a reference frame; and a control unit 670 configured to control a position of the object table by providing an object table control signal 676 to the positioning module PM to generate an appropriate force on the object table OT, e.g. based on the measured position of the object table OT and a set point 275 for the object table OT. In a similar manner as discussed with reference to FIG. 3, the control unit 670 is further configured to control a vertical position of the second position module member 640 by provide an actuator control signal 677 to the one or more actuators 390, so as to maintain a top surface 640.1 of the second positioning module member 640 substantially parallel to a bottom surface 610.1 of the first positioning module member 610. In such embodiment, the second position module member 640 can be made to follow a vertical position of the first position module member 610, this allowing to maintain a substantially constant, comparatively small air gap d between the first position module member 610 and the second position module member 640.

With respect to the position measurement system 260 as e.g. applied in the first, second and third embodiment of the positioning devices 300, 500, 600 according to the present invention, it can be mentioned that various options exist to implement such measurement system. Examples of such measurement systems include, but are not limited to, encoder based measurement systems, interferometer based measurement systems, capacitive or inductive measurement systems, gas gauge proximity sensors, etc. In case of an interferometer based or encoder based measurement system, the measurement system typically includes a sensor that is configured to emit a measurement beam and a sensor target to receive the measurement beam. Such a sensor target may comprise a one or two dimensional grating, in case of an encoder based measurement system or a mirror in case of an interferometric system. In order to determine a distance between a reference frame, e.g. a frame to which the projection system PS as shown in FIGS. 3, 5 and 6 is mounted and an object table, one of the sensor and the sensor target may be mounted to the reference frame, whereas the other of the sensor and the sensor target may be mounted to the object table. In an embodiment of the present invention, the object table is provided with a two-dimensional grating, configured to co-operate with an encoder based sensor that is mounted to the reference frame. In such an embodiment, a plurality of sensors may be mounted to the reference frame in order to maintain positional control of the object table over comparatively large distances, e.g. distances comparable or larger than the width or length or diameter of the object that is mounted to the object table. By mounting the grating to the object table, rather than mounting the sensors on the object table, no wiring may be required between 'stationary world', i.e. the reference frame or the base frame BF and the object table, as the grating is a substantially passive component that does not need a power supply. In a similar manner, when considering the positioning module as applied in the present invention, it may be advantageous to apply a planar motor as a component of the positioning module as shown in FIG. 6, whereby the member of the positioning module to which the object table is mounted, i.e. the first positioning module member 610 of FIG. 6, is provided with a two-dimensional array of permanent magnets whereas the second positioning module member 640 of FIG. 6 is provided with a two-dimensional array of coils to be energized. Similarly, with respect to the embodiments of FIGS. 3 and 5, it may be advantageous to apply a planar motor as a component of the bottom module, whereby the member of the bottom module to which the top module is mounted, i.e. the first bottom module member 230 of FIG. 3 or the first bottom module member 530 of FIG. 5, is provided with a two-dimensional array of permanent magnets whereas the second bottom module member, i.e. the second bottom module member 340 of FIG. 3 or the second bottom module member 240 of FIG. 5 is provided with a two-dimensional array of coils to be energized. By doing so, a further reduction of cabling or wiring between the stationary world and the structure to which the object table OT is mounted can be realised. This may result in an improved positional accuracy of the positioning of the object table OT.

With respect to the first, second and third embodiment of the positioning device according to the present invention, it is worth mentioning that the application of the actuators 390 and the actuators 590 may be combined in a further embodiment of the positioning device according to the present invention.

With respect to the bottom module LSM as applied in the positioning devices 300, 500 according to the present invention, it is worth mentioning that the present invention is particularly suited to be applied in combination with a planar motor as the bottom module LSM. As will be understood by the skilled person, it would be advantageous to have the weight of the first bottom module member (e.g. member 230 of FIG. 3 or member 530 of FIG. 5) as low as possible, in order to obtain a desired acceleration with as few force as possible. In case of the use of a planar motor, a slim design of the mover part of the planar motor, e.g. two-dimensional permanent magnet array forming the first long-stroke member (230, 530) would be preferred. However, such a slim or thin structure is particularly sensitive to vibrations induced by the top module SSM. By means of the present invention, in particular the application of the actuators 390 and/or 590, a nominal air gap, e.g. the gap d as shown in FIG. 3 or 5, of a planar motor used as bottom module LSM can be kept small, e.g. less than 1 mm, preferably less than 0.5 mm or even more preferably less than 0.3 mm. As a result, an improved damping of the aforementioned vibrations can be obtained. In addition, the efficiency of the planar motor may be improved as well.

The positioning device 300, 500, 600 according to the present invention may advantageously be applied in a lithographic apparatus according to the present invention, e.g. for the positioning of an object table configured to hold a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A positioning device configured to position an object, the positioning device comprising:
    an object table configured to hold the object;
    a positioning module configured to position the object table, the positioning module comprising:
        a first positioning module member configured to hold the object table;
        a second positioning module member configured to support the first positioning module member and to co-operate with the first positioning module member to generate a first force:
    a support frame configured to support the second positioning module member;
    at least one actuator configured to displace the second positioning module member in a vertical direction relative to the support frame;
    a position measurement system configured to measure a position of the object table with respect to a reference frame; and a control unit configured to control a position of the object table by providing an object table control signal to the positioning module to generate the first force, based on the measured position of the object table and a set point for the object table;
wherein the control unit is further configured to control a vertical position of the second position module member by providing an actuator control signal to the at least one actuator, so as to maintain a top surface of the second positioning module member substantially parallel to a bottom surface of the first positioning module member.

2. The positioning device according to claim 1, wherein the positioning module comprises a top module and a bottom module;
the top module comprising:
a first top module member configured to hold the object table;
a second top module member configured to co-operate with the first top module member to generate the first force on the object table;
the bottom module comprising:
a first bottom module member configured to hold the second top module member;
a second bottom module member configured to support the first bottom module member and to co-operate with the first bottom module member to generate a second force on the second top module member;
whereby the top module and the first bottom module member constitute the first positioning module member, the second bottom module member constitutes the second positioning module member and a bottom surface of the first bottom member constitutes the bottom surface of the first positioning module member.

3. The positioning device according to claim 1, wherein the object table control signal comprises a top control signal for generating the first force on the object table and a bottom control signal for generating the second force on the second top module member to maintain a position of the first top module member relative to the second top module member within an operating range.

4. The positioning device according to claim 1, wherein the second positioning module member is configured to move relative to the support frame in response to a horizontal force.

5. A positioning device configured to position an object, the positioning device comprising:
an object table configured to hold the object;
a positioning module configured to position the object table, the positioning module comprising a top module and a bottom module;
the top module comprising:
a first top module member configured to hold the object table;
a second top module member configured to co-operate with the first op module member to generate a first force on the object table;
the bottom module comprising:
at least one actuator;
a first bottom module member onto which the second top module member is displaceably mounted by means of the at least one actuator; at least one actuator being configured to displace move the second top module member in a vertical direction relative to the first bottom module member;
a second bottom module member configured to support the first bottom module member and to co-operate with the first bottom module member to generate a second force on the first top module member;
a support frame configured to support the second bottom module member;
a position measurement system configured to measure a position of the object table with respect to a reference frame;
a control unit configured to control a position of the object table by providing an object table control signal to the positioning module to generate the first force and the second force, based on the measured position of the object table and a set point for the object table;
wherein the control unit is further configured to control a vertical position of the second top module member by providing an actuator control signal to the at least one actuator, in order to maintain the second top module member within the operating range of the first top module member in the vertical direction.

6. The positioning device according to claim 5, wherein the object table control signal comprises a top control signal for generating the first force on the object table and a bottom control signal for generating the second force on the first bottom module member to so as to maintain a top surface of the second bottom module member substantially parallel to a bottom surface of the first bottom module member.

7. The positioning device according to claim 5, wherein the second bottom module member is configured to displace relative to the support frame in response to a horizontal force.

8. The positioning device according to claim 2, wherein the first bottom module member and the second bottom module member constitute a planar motor.

9. The positioning device according to claim 8, wherein the planar motor comprises a two-dimensional magnet array as the first top module member and a two-dimensional coil array as the second top module member, the two-dimensional coil array being configured to co-operate with the two-dimensional magnet array to generate the second force.

10. The positioning device according to claim 2 wherein the at least one actuator comprise one or more comprises at least one of a piezo-electrical actuator, a magnetostrictive actuator, a cam-disc type actuators actuator, and a pneumatic actuator.

11. The positioning device according to claim 2, wherein the top module comprises a plurality of electromagnetic actuators for positioning the object table in 6 degrees of freedom.

12. The positioning device according to claim 2, wherein the support frame is configured to displaceably support at least one of the second bottom module member and the second positioning module member, by means of an air bearing arranged between the support frame and one of the second bottom module member and the second positioning module member.

13. The positioning device according to claim 2, wherein the support frame is configured to displaceably support one of the second bottom module member and the second positioning module member by means of flexible supports, such as leaf springs, arranged between the support frame and one of the second bottom module member and the second positioning module member.

14. The positioning device according to claim 2, wherein the vertical position of the first top module member comprises at least one of a Z-position, an Rx-position and an Ry-position.

15. A lithographic apparatus comprising:
an illumination system configured to condition a radiation beam;
a support constructed to support a patterning device, the patterning device being capable of imparting a pattern to a cross-section of the radiation beam to form a patterned radiation beam;
a substrate table constructed to hold a substrate; and
a projection system configured to project the patterned radiation beam onto a target portion of the substrate, wherein the lithographic apparatus further comprises a positioning device, the positioning device comprising a positioning module configured to position the object table, the positioning module comprising
a first positioning module member configured to hold the object table,
a second positioning module member configured to support the first positioning module member and to co-operate with the first positioning module member to generate a first force,
a support frame configured to support the second positioning module member,
at least one actuator configured to displace the second positioning module member in a vertical direction relative to the support frame,
a position measurement system configured to measure a position of the object table with respect to a reference frame, and
a control unit configured to control a position of the object table by providing an object table control signal to the positioning module to generate the first force, based on the measured position of the object table and a set point for the object table;
wherein the control unit is further configured to control a vertical position of the second position module member by providing an actuator control signal to the at least one actuator, so as to maintain a top surface of the second positioning module member substantially parallel to a bottom surface of the first positioning module member.

16. The positioning device according to claim 5 wherein the at least one actuator comprises piezo-electrical actuator, a magnetostrictive actuator, a cam-disc type actuator, and a pneumatic actuator.

17. The positioning device according to claim 5, wherein the support frame is configured to displaceably support at least one of the second bottom module member and the second positioning module member, by means of an air bearing arranged between the support frame and one of the second bottom module member and the second positioning module member.

18. A method of manufacturing a device, the method comprising the steps of:
providing a positioning device comprising a positioning module configured to position the object table, the positioning module comprising a first positioning module member configured to hold the object table, a second positioning module member configured to support the first positioning module member and to co-operate with the first positioning module member to generate a first force, a support frame configured to support the second positioning module member, at least one actuator configured to displace the second positioning module member in a vertical direction relative to the support frame, a position measurement system configured to measure a position of the object table with respect to a reference frame, and a control unit configured to control a position of the object table by providing an object table control signal to the positioning module to generate the first force, based on the measured position of the object table and a set point for the object table, wherein the control unit is further configured to control a vertical position of the second position module member by providing an actuator control signal to the at least one actuator, so as to maintain a top surface of the second positioning module member substantially parallel to a bottom surface of the first positioning module member;
using the positioning device to position a substrate to a position at which a patterned beam of radiation may be projected;
projecting the patterned beam of radiation onto the substrate.

* * * * *